United States Patent
Ikezawa et al.

(10) Patent No.: US 7,688,422 B2
(45) Date of Patent: Mar. 30, 2010

(54) PROJECTION OPTICAL SYSTEM, EXPOSURE SYSTEM, AND EXPOSURE METHOD

(75) Inventors: Hironori Ikezawa, Fukaya (JP); Yasuhiro Omura, Kounosu (JP)

(73) Assignee: Nikon Corporation, Tokyo (JP)

( * ) Notice: Subject to any disclaimer, the term of this patent is extended or adjusted under 35 U.S.C. 154(b) by 258 days.

(21) Appl. No.: 11/665,490

(22) PCT Filed: Oct. 12, 2005

(86) PCT No.: PCT/JP2005/018807
§ 371 (c)(1),
(2), (4) Date: May 31, 2007

(87) PCT Pub. No.: WO2006/043457
PCT Pub. Date: Apr. 27, 2006

(65) Prior Publication Data
US 2007/0285633 A1    Dec. 13, 2007

(30) Foreign Application Priority Data
Oct. 18, 2004   (JP)  ............................. 2004-303191

(51) Int. Cl.
*G03B 27/42* (2006.01)
*G03B 27/58* (2006.01)
*G03B 27/54* (2006.01)

(52) U.S. Cl. .............................. 355/53; 355/72; 355/67
(58) Field of Classification Search ................... 355/30, 355/53, 55, 67, 72; 359/30, 196, 227, 381, 359/754; 250/201.4
See application file for complete search history.

(56) References Cited

U.S. PATENT DOCUMENTS

| 7,309,870 B2 | 12/2007 | Omura |
| 2005/0132914 A1* | 6/2005 | Mulkens et al. ............ 101/463.1 |
| 2005/0259234 A1 | 11/2005 | Hirukawa et al. |
| 2006/0001981 A1 | 1/2006 | Omura |

(Continued)

FOREIGN PATENT DOCUMENTS

DE            224 448 A1      7/1985

(Continued)

OTHER PUBLICATIONS

Haferkorn, "Optik," *Barth Verlagsgesellschaft*, Leipzig, Berlin, Heidelberg, 1994, pp. 665-666 (with translation).

*Primary Examiner*—Peter B Kim
(74) *Attorney, Agent, or Firm*—Oliff & Berridge, PLC

(57) ABSTRACT

An imaging optical system is a system of a liquid immersion type permitting a plane-parallel plate in liquid to be replaced with another, without substantial degradation of imaging performance, while ensuring sufficiently high laser resistance of a boundary lens. The imaging optical system is provided with a first optically transparent member located nearest to a second plane, and a second optically transparent member located adjacent to the first optically transparent member. An optical path between the first optically transparent member and the second plane is fillable with a first liquid and an optical path between the first optically transparent member and the second optically transparent member is fillable with a second liquid. The imaging optical system satisfies the condition of $1<D1/(M1+M2)<20$, where $D1$ is a center thickness of the first optically transparent member, $M1$ a center thickness of a layer of the first liquid, and $M2$ a center thickness of a layer of the second liquid.

44 Claims, 10 Drawing Sheets

U.S. PATENT DOCUMENTS

2006/0121364 A1 6/2006 Omura

FOREIGN PATENT DOCUMENTS

| JP | A 10-303114 | 11/1998 |
| JP | A 2004-205698 | 7/2004 |
| WO | WO 99/49504 | 9/1999 |
| WO | WO 2004/019128 A2 | 3/2004 |
| WO | WO 2004/053955 A1 | 6/2004 |
| WO | WO 2004/084281 A1 | 9/2004 |
| WO | WO 2004/107011 A1 | 12/2004 |
| WO | WO 2005/059617 A2 | 6/2005 |
| WO | WO 2005/059617 A3 | 6/2005 |
| WO | WO 2005/069055 A2 | 7/2005 |
| WO | WO 2005/069055 A3 | 7/2005 |

\* cited by examiner

PROJECTION OPTICAL SYSTEM, EXPOSURE SYSTEM, AND EXPOSURE METHOD

CROSS-REFERENCE TO RELATED APPLICATIONS

This application is based upon and claims the benefit of priorities from International Application No. PCT/JP2005/018807 filed on Oct. 12, 2005, and Japanese Patent Application No. 2004-303191 filed on Oct. 18, 2004, the entire contents of which are incorporated herein by reference.

BACKGROUND

1. Field

One embodiment of the present invention relates to a projection optical system, exposure apparatus, and exposure method and, more particularly, to a projection optical system suitably applicable to exposure apparatus used in manufacturing microdevices, such as semiconductor devices and liquid-crystal display devices, for example, by photolithography.

2. Description of the Related Art

The photolithography for manufacturing the semiconductor devices or the like is carried out using an exposure apparatus for projecting an image of a pattern of a mask (or reticle) through a projection optical system onto a photosensitive substrate (a wafer, a glass plate, or the like coated with a photoresist) to effect exposure thereof. In the exposure apparatus, the required resolving power (resolution) of the projection optical system is becoming higher and higher with increase in integration degree of the semiconductor devices or the like.

In order to meet the demand for the resolving power of the projection optical system, it is necessary to decrease the wavelength $\lambda$ of illumination light (exposure light) and to increase the image-side numerical aperture NA of the projection optical system. Specifically, the resolution of the projection optical system is expressed by $k \cdot \lambda / NA$ (k is a process factor). The image-side numerical aperture NA is represented by $n \cdot \sin \theta$, where n is a refractive index of a medium (normally, gas such as air) between the projection optical system and the photosensitive substrate and $\theta$ a maximum angle of incidence to the photosensitive substrate.

In this case, when one attempts to increase the image-side numerical aperture by increase in the maximum incidence angle $\theta$, it will result in increase in incidence angles to the photosensitive substrate and in exiting angles from the projection optical system, so as to increase reflection loss on optical surfaces, and it will eventually fail to ensure a large effective image-side numerical aperture. Therefore, a liquid immersion technique has been proposed in International Publication WO2004/019128, which increases in the image-side numerical aperture by filling the optical path between the projection optical system and the photosensitive substrate with a medium like a liquid having a high refractive index.

SUMMARY

An embodiment of the present invention provides a liquid immersion type projection optical system permitting replacement of an in-liquid plane-parallel plate without substantial degradation of imaging performance while ensuring sufficiently high laser resistance of a boundary lens. It is another embodiment of the present invention provides an exposure apparatus and exposure method capable of effecting highly accurate and stable projection exposure of a fine pattern, using a high-resolution liquid-immersion-type projection optical system with a large image-side numerical aperture permitting replacement of an in-liquid plane-parallel plate.

For purposes of summarizing the invention, certain aspects, advantages, and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessary achieving other advantages as may be taught or suggested herein.

The projection optical system in accordance with an embodiment of the present invention is a projection optical system for projecting an image of a first plane onto a second plane. The projection optical system comprising:

a first optically transparent member located nearest to the second plane, and a second optically transparent member located adjacent to the first optically transparent member, wherein an optical path between the first optically transparent member and the second plane is filled with a first liquid, and wherein an optical path between the first optically transparent member and the second optically transparent member is filled with a second liquid, the projection optical system satisfying the following condition:

$$1 < D1/(M1+M2) < 20,$$

where D1 is a center thickness of the first optically transparent member, M1 a center thickness of a layer of the first liquid, and M2 a center thickness of a layer of the second liquid.

The projection optical system in accordance with another embodiment of the present invention is a projection optical system for projecting an image of a first plane onto a second plane. The projection optical system comprising:

a first optically transparent member located nearest to the second plane, and a second optically transparent member located adjacent to the first optically transparent member, wherein an optical path between the first optically transparent member and the second plane is filled with a first liquid, and wherein an optical path between the first optically transparent member and the second optically transparent member is filled with a second liquid, the projection optical system satisfying the following condition:

$$0.007 < D1/D2 < 0.05,$$

where D1 is a center thickness of the first optically transparent member, and D2 a sum of center thicknesses of all optically transparent members in the projection optical system.

The exposure apparatus in accordance with an embodiment of the present invention comprising the projection optical system of the first aspect or the second aspect for projecting an image of a predetermined pattern set on the first plane, onto a photosensitive substrate set on the second plane.

The exposure method accordance with an embodiment of the present invention uses a projection optical system of an embodiment of the present invention. In one example of this exposure method, a predetermined pattern set on the first plane; and an image of the pattern is exposed and projected onto a photosensitive substrate set on the second plane, through the projection optical system.

The device manufacturing method accordance with an embodiment of the present invention uses a projection optical system of an embodiment of the present invention. In one example of this device manufacturing method, a predetermined pattern set on the first plane; an image of the pattern is projected onto a photosensitive substrate set on the second plane, through the projection optical system; and the photosensitive substrate is developed.

The imaging optical system in accordance with an embodiment of the present invention is an imaging optical system for making a first plane optically conjugate with a second plane. The imaging optical system comprising:

a first optically transparent member located nearest to the second plane, and a second optically transparent member located adjacent to the first optically transparent member, wherein an optical path between the first optically transparent member and the second plane is filled with a first liquid, and wherein an optical path between the first optically transparent member and the second optically transparent member is filled with a second liquid, the imaging optical system satisfying the following condition:

$$1 < D1/(M1+M2) < 20,$$

where D1 is a center thickness of the first optically transparent member, M1 a center thickness of a layer of the first liquid, and M2 a center thickness of a layer of the second liquid.

The imaging optical system accordance with another embodiment of the present invention is an imaging optical system for making a first plane optically conjugate with a second plane. The imaging optical system comprising:

a first optically transparent member located nearest to the second plane, and a second optically transparent member located adjacent to the first optically transparent member, wherein an optical path between the first optically transparent member and the second plane is filled with a first liquid, and wherein an optical path between the first optically transparent member and the second optically transparent member is filled with a second liquid, the imaging optical system satisfying the following condition:

$$0.007 < D1/D2 < 0.05,$$

where D1 is a center thickness of the first optically transparent member, and D2 a sum of center thicknesses of all optically transparent members in the projection optical system.

DESCRIPTION OF THE EMBODIMENTS

Figure 1:
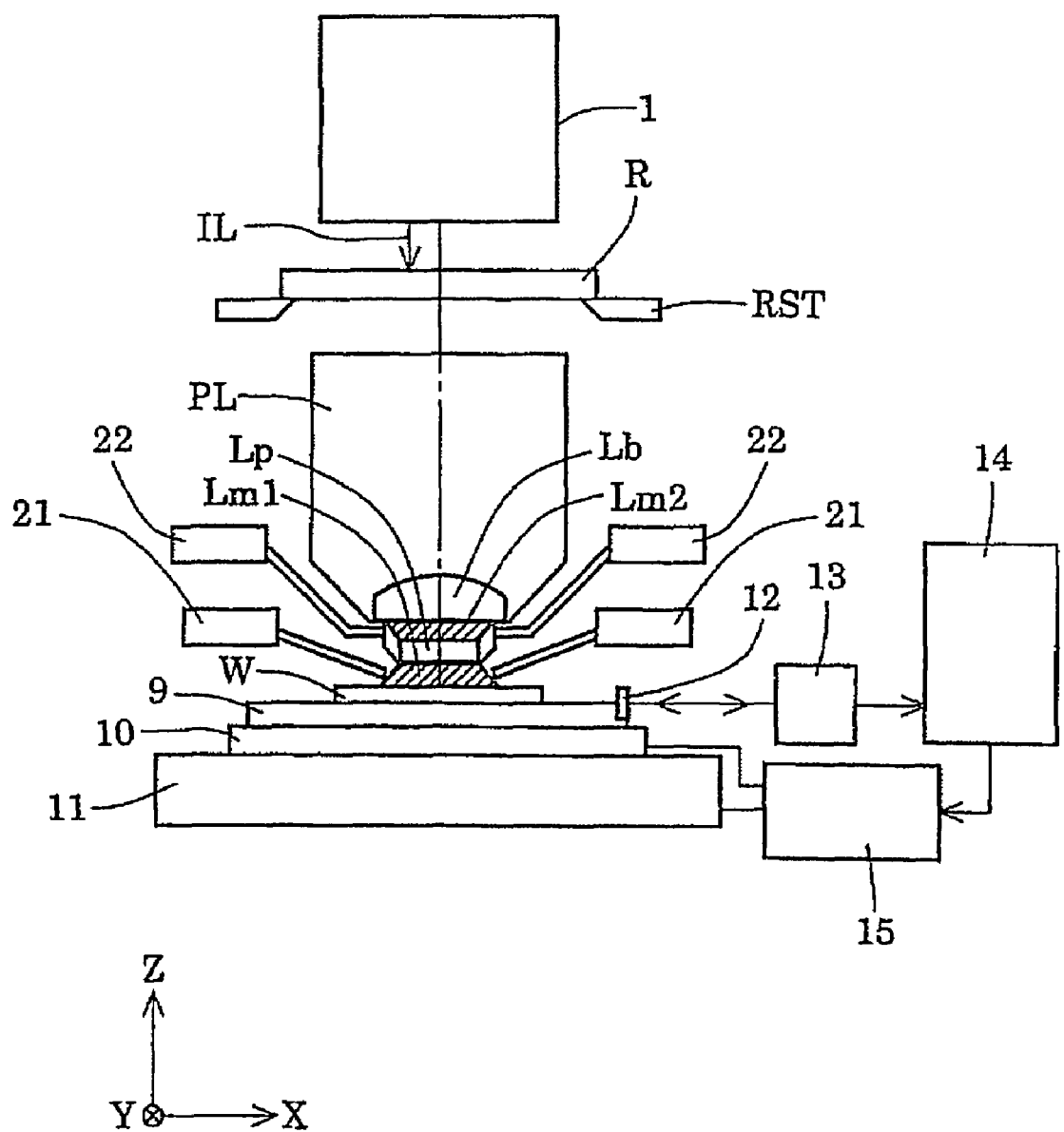
FIG. 1 is a drawing schematically showing a configuration of an exposure apparatus according to an embodiment of the present invention.

A liquid immersion type projection optical system according to an embodiment of the present invention comprises a first optically transparent member which is located nearest to the image (second plane) and which has a surface on the object side (first plane side) in contact with a second liquid and a surface on the image side in contact with a first liquid, and a boundary lens (second optically transparent member) which is located adjacent to the first optically transparent member and which has a surface on the object side in contact with gas and a surface on the image side in contact with the second liquid. The first liquid and the second liquid having the refractive index larger than 1.1 can be, for example, pure water. In general, the first liquid and the second liquid can be selected from liquids that are transparent to used light, that have a refractive index as high as possible, and, in the case of exposure apparatus, that are stable against a photoresist laid on a surface of a substrate. The applicable first optically transparent member is an optically transparent member of almost zero refractive power having low decentration sensitivity, e.g., a plane-parallel plate.

In the projection optical system of the liquid immersion type having the large image-side numerical aperture over 1, the boundary lens has a surface on the object side (mask side in the exposure apparatus) in contact with gas and a surface on the image side (wafer side in the exposure apparatus) in contact with the liquid (immersion liquid), and the object-side surface of the boundary lens is of a convex shape having a small radius of curvature. This is for keeping relatively small a maximum angle of incidence of rays incident to the object-side surface of the boundary lens, while ensuring the large image-side numerical aperture.

In the embodiment of the present invention, as described above, the liquid like pure water with a large refractive index is interposed in the optical path between the boundary lens and the image plane, whereby a relatively large effective imaging region can be secured while ensuring a large effective image-side numerical aperture.

The boundary lens is a positive lens with a large power (refractive power) and thus the boundary lens itself comes to have high decentration sensitivity. The "high decentration sensitivity" of the boundary lens means that the degree of degradation of imaging performance due to decentration error of the boundary lens is high. In consequence, it is very difficult to replace the boundary lens with another while avoiding the degradation of imaging performance, even in the case where the liquid is contaminated with the photoresist or the like laid on the wafer and where the image-side optical surface of the boundary lens is considerably contaminated with the contaminated liquid.

Since the first optically transparent member like the plane-parallel plate is located in the optical path between the boundary lens and the image plane (a wafer in the case of exposure apparatus), contamination of the image-side optical surface of the boundary lens due to the contaminated liquid can be prevented by the first optically transparent member interposed between the boundary lens and the wafer even if the liquid (first liquid) is contaminated by the photoresist or the like laid on the wafer.

In this configuration, since the plane-parallel plate (hereinafter referred to as "in-liquid plane-parallel plate") itself has no refractive power, the decentration sensitivity of the in-liquid plane-parallel plate is kept low by setting the index difference small between the refractive indices of the in-liquid plane-parallel plate and the liquid.

This results in effectively preventing the contamination of the image-side optical surface of the boundary lens due to the contaminated liquid by shield effect of the in-liquid plane-parallel plate and permits us to replace the in-liquid plane-parallel plate with another on an as-needed basis while substantially avoiding the degradation of the imaging performance, in the case of considerable contamination of the image-side optical surface of the in-liquid plane-parallel plate.

However, this configuration involves a concern that the laser resistance of the boundary lens worsens because of influence of compaction or the like if the in-liquid plane-parallel plate is too thin and a concern that replacement of members degrades the imaging performance because of internal heterogeneity, increase in decentration sensitivity, etc. if the in-liquid plane-parallel plate is too thick.

In the embodiment of the present invention, the above-described configuration is preferably arranged to satisfy Conditional Expression (1) below. In Conditional Expression (1), D1 is a center thickness of the first optically transparent member, M1 a center thickness of a layer of the first liquid, and M2 a center thickness of a layer of the second liquid.

$$1 < D1/(M1+M2) < 20 \tag{1}$$

When the ratio is over the upper limit of Conditional Expression (1), the center thickness D1 of the first optically transparent member will become too large, and it will lead to high decentration sensitivity of the first optically transparent member and increase in influence of heterogeneity of refractive index in the first optically transparent member. As a result, on the occasion of replacement of the contaminated first optically transparent member, the imaging performance of the projection optical system will degrade because of increase in the internal heterogeneity and decentration sensitivity of the first optically transparent member. Particularly, too large D1 is not preferable because it will give rise to significant decentration coma on the occasion of replacement. When the ratio is over the upper limit of Conditional Expression (1), the second optically transparent member (boundary lens) will be located away from the image plane, so as to raise a concern that it becomes difficult to implement compensation for spherical aberration, which is not preferred.

On the other hand, when the ratio is below the lower limit of Conditional Expression (1), the center thickness D1 of the first optically transparent member will become too small and it will result in making the distance small between the boundary lens and the image plane (wafer in the case of exposure apparatus). This is because the center thickness M1 of the layer of the first liquid and the center thickness M2 of the layer of the second liquid are set as small as possible, in order to keep optical loss small in the liquid like pure water. It results in increasing an optical energy per unit area in the boundary lens as the second optically transparent member and degrading the laser resistance of the boundary lens. When the center thickness M1 of the layer of the first liquid and the center thickness M2 of the layer of the second liquid are large relative to the center thickness D1 of the first optically transparent member, there is a concern that it becomes difficult to implement compensation for spherical aberration because the refractive indices of the first liquid and the second liquid are smaller than that of the first optically transparent member.

Incidentally, fluorite has a property of being soluble in water (solubility) and, therefore, if the boundary lens is made of fluorite, it will become difficult to maintain stable imaging performance of the projection optical system. It is also known that an internal index distribution of fluorite has a high-frequency component, and variation in refractive index including this high-frequency component could give rise to flare and is likely to degrade the imaging performance of the projection optical system. Furthermore, it is known that fluorite has intrinsic birefringence, and it is thus necessary to compensate for influence of this intrinsic birefringence, in order to maintain good imaging performance of the projection optical system.

In terms of the solubility, the high-frequency component in the index distribution, and the intrinsic birefringence of fluorite, therefore, it is preferable to make the boundary lens of silica, but if the ratio is below the lower limit of Conditional Expression (1) and therefore the optical energy per unit area is increased, it will become likely to cause local index change or compaction due to volume constriction and the imaging performance of the projection optical system will become likely to degrade because of influence of the compaction. In order to better exercise the effect of the present invention, it is preferable to set the upper limit of Conditional Expression (1) to 10 and to set the lower limit thereof to 1.5.

In the embodiment of the present invention, it is preferable to satisfy Conditional Expression (2) below. In Conditional Expression (2), D1 is the center thickness of the first optically transparent member as described above, and D2 the sum of center thicknesses of all optically transparent members (including the first optically transparent member and the second optically transparent member (boundary lens)) in the projection optical system.

$$0.007 < D1/D2 < 0.05 \tag{2}$$

When the ratio is over the upper limit of Conditional Expression (2), the center thickness D1 of the first optically transparent member will become too large, and it will lead to high decentration sensitivity of the first optically transparent member and increase in influence of heterogeneity of refractive index inside the first optically transparent member. This will result in degradation of imaging performance of the projection optical system due to increase in internal heterogeneity and decentration sensitivity of the first optically transparent member on the occasion of replacement of the first optically transparent member as considerably contaminated, which is not preferred. Particularly, too large D1 is not preferable because it will give rise to significant decentration coma on the occasion of replacement when the ratio is over the upper limit of Conditional Expression (2), the second optically transparent member (boundary lens) will be located away from the image plane and it could become difficult to implement compensation for spherical aberration, which is not preferred.

On the other hand, when the ratio is below the lower limit of Conditional Expression (2), the center thickness D1 of the first optically transparent member will be too small, so as to decrease the distance between the boundary lens and the image plane (wafer in the case of exposure apparatus) and this will lead to increase in the optical energy per unit area in the boundary lens and degradation of the laser resistance of the boundary lens due to influence of compaction, which is not preferred. If the center thickness M1 of the layer of the first liquid and the center thickness M2 of the layer of the second liquid are large relative to the center thickness D1 of the first optically transparent member, it could become difficult to implement compensation for spherical aberration because the refractive indices of the first liquid and the second liquid are lower than that of the first optically transparent member. In order to better exercise the effect of the present invention, it is preferable to set the upper limit of Conditional Expression (2) to 0.04 and to set the lower limit thereof to 0.01.

In embodiment of the present invention, in order to achieve simplification of a supply/discharge mechanism of liquid, or the like, the first liquid and the second liquid are preferably the same liquid, e.g., pure water. In the present invention, the boundary lens as the second optically transparent member is preferably a positive lens made of an amorphous material and more preferably a positive lens made of silica As described above, when the boundary lens is made of an amorphous material such as silica, the image-side optical surface of the boundary lens becomes less likely to be affected by the liquid such as pure water, and it becomes feasible to maintain good imaging performance of the projection optical system over a long period of time. When the boundary lens has a positive refractive power, it becomes easier to ensure a large image-side numerical aperture of the projection optical system.

In the embodiment of the present invention, the image-side optical surface of the boundary lens as the second optically transparent member is preferably formed in a planar shape. In this configuration, when a plane-parallel plate is used as the first optically transparent member, the layer of the first liquid and the layer of the second liquid are formed in a plane-parallel plate shape so as to keep a transmittance distribution uniform in the liquid layers.

In the embodiment of the present invention, in terms of the solubility, the high-frequency component in index distribution, and the intrinsic birefringence of fluorite, the first optically transparent member is preferably a plane-parallel plate made of an amorphous material. As described above, when the first optically transparent member is made of an amorphous material such as silica, the optical surfaces of the first optically transparent member become less likely to be affected by the liquid such as pure water, and the imaging performance of the projection optical system can be maintained stable. As described above, when the first optically transparent member is formed in the plane-parallel plate shape, the decentration sensitivity of this in-liquid plane-parallel plate is kept small, and with progress in contamination of the image-side optical surface of the in-liquid plane-parallel plate, it becomes feasible to replace the in-liquid plane-parallel plate or to remove and clean the in-liquid plane-parallel plate on an as-needed basis, while substantially avoiding the degradation of imaging performance.

As described above, the embodiment of the present invention succeeds in realizing the liquid immersion type projection optical system permitting replacement of the in-liquid plane-parallel plate without substantial degradation of imaging performance while ensuring sufficiently high laser resistance of the boundary lens. Therefore, the exposure apparatus and exposure method of the present invention are able to achieve highly accurate and stable projection exposure of a fine pattern, using the high-resolution liquid-immersion-type projection optical system with a large image-side numerical aperture permitting replacement of the in-liquid plane-parallel plate.

An embodiment of the present invention will be described on the basis of the accompanying drawings. FIG. 1 is a drawing schematically showing a configuration of an exposure apparatus according to the embodiment of the present invention. In FIG. 1, the X-axis and Y-axis are set along directions parallel to a wafer W, and the Z-axis is set along a direction perpendicular to the wafer W. More specifically, the XY plane is set in parallel with a horizontal plane, and the +Z-axis is set upward along the vertical direction.

The exposure apparatus of the present embodiment, as shown in FIG. 1, is provided with an illumination optical system 1 which includes, for example, an ArF excimer laser light source as an exposure light source and which comprises of an optical integrator (homogenizer), a field stop, a condenser lens, and so on. Exposure light (exposure beam) IL, which is UV pulsed light of the wavelength of 193 nm emitted from the light source, travels through the illumination optical system 1 to illuminate a reticle (mask) R. A pattern to be transferred is formed in the reticle R, and is illuminated in a pattern region of a rectangular shape (slit shape) having longer sides along the X-direction and shorter sides along the Y-direction, in the entire pattern region.

Examples of the illumination optical system 1 are described in U.S. Patent Publication Nos. 2006/0055834A1, 2006/0171138A1, and 2006/0170901A1, the teachings of which are hereby incorporated by reference.

The light having passed through the reticle R travels through the liquid immersion type projection optical system PL to form a reticle pattern at a predetermined reducing projection magnification in an exposure region on a wafer (photosensitive substrate) W coated with a photoresist. Namely, a pattern image is formed in a still exposure region (effective exposure region) of a rectangular shape having longer sides along the X-direction and shorter sides along the Y-direction, on the wafer W, so as to optically correspond to the rectangular illumination region on the reticle R.

Figure 2:
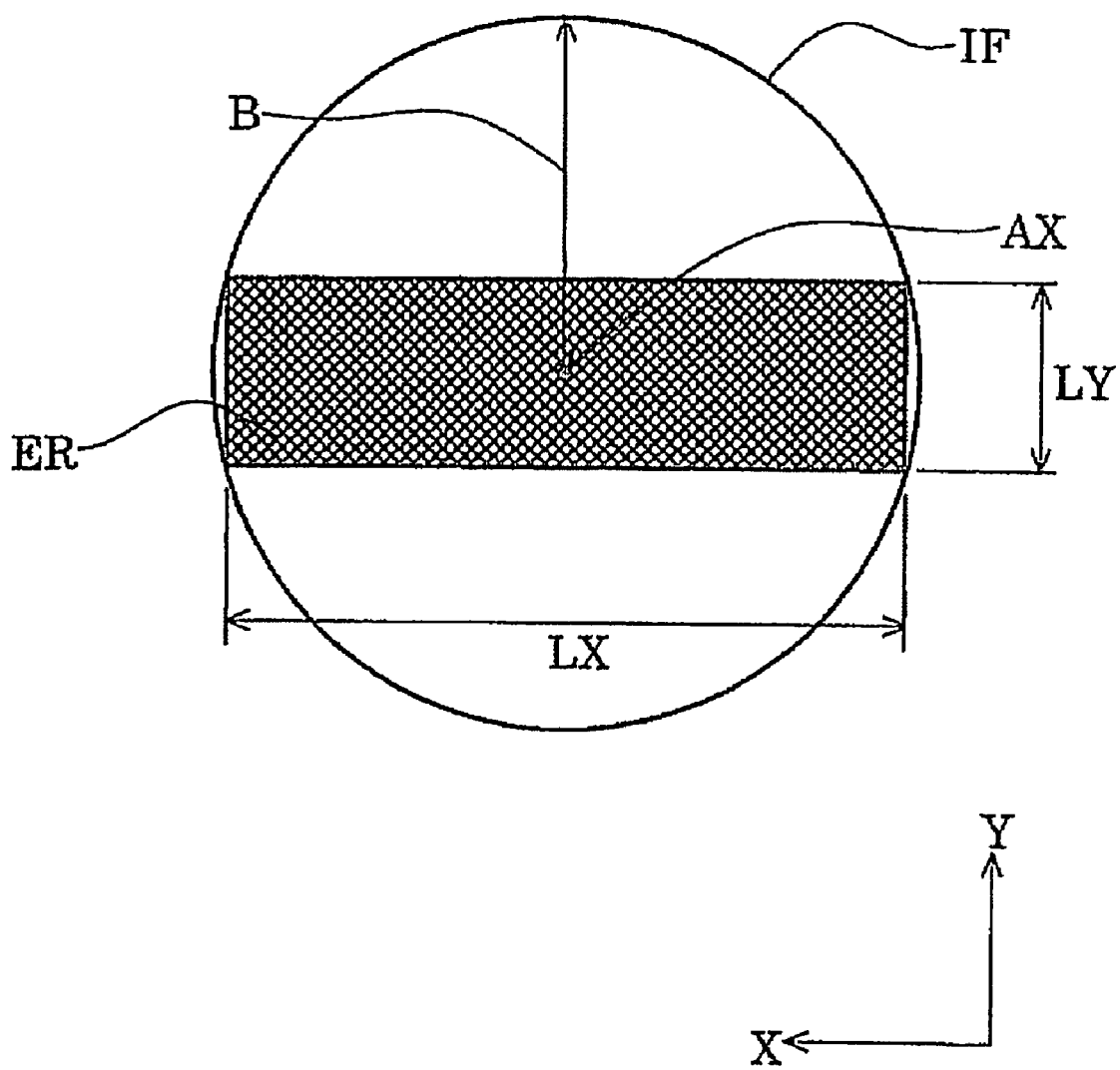
FIG. 2 is a drawing showing a positional relation between a still exposure region of rectangular shape formed on a wafer and the optical axis of a projection optical system in each example of the embodiment.

FIG. 2 is a drawing showing the positional relation between the rectangular still exposure region formed on the wafer and the optical axis of the projection optical system in each of examples of the present embodiment. In each example of the present embodiment, as shown in FIG. 2, the rectangular still exposure region ER extending along the X-direction with a center on the optical axis AX is set in a circular region (image circle) IF centered on the optical axis AX of the projection optical system PL and having a radius B. The X-directional length of the still exposure region ER is LX and the Y-directional length LY.

Therefore, corresponding to the still exposure region, the rectangular illumination region (or still illumination region) having the size and shape corresponding to the still exposure region ER with a center on the optical axis AX is formed on the reticle R though not depicted. The reticle R is held in parallel with the XY plane on a reticle stage RST, and the reticle stage RST incorporates a mechanism for finely moving the reticle R in the X-direction, Y-direction, and direction of rotation. The reticle stage RST is arranged so that the X-directional, Y-directional, and rotational positions thereof are measured and controlled in real time with a reticle laser interferometer (not shown).

The wafer W is fixed in parallel with the XY plane on a Z-stage 9 through a wafer holder (not shown). The Z-stage 9 is fixed on an XY stage 10 arranged to move along the XY plane substantially parallel to the image plane of the projection optical system PL, and controls the focus position (Z-directional position) and inclination angle of the wafer W. The Z-stage 9 is arranged so that the X-directional, Y-directional, and rotational positions are measured and controlled in real time with a wafer laser interferometer 13 using a moving mirror 12 placed on the Z-stage 9.

The XY stage 10 is mounted on a base 11 and controls the position of the wafer W in the X-direction, in the Y-direction, and in the rotational direction. On the other hand, a main control system 14 disposed in the exposure apparatus of the present embodiment is arranged to adjust the position in the X-direction, in the Y-direction, and in the rotational direction of the reticle R on the basis of measured values by the reticle laser interferometer. Namely, the main control system 14 sends a control signal to the mechanism incorporated in the reticle stage RST to finely move the reticle stage RST, thereby adjusting the position of the reticle R.

The main control system 14 adjusts the focus position (Z-directional position) and inclination angle of the wafer W in order to match the front surface on the wafer W with the image plane of the projection optical system PL by an autofocus method and autoleveling method. Namely, the main control system 14 sends a control signal to a wafer stage driving system 15 to drive the Z-stage 9 by the wafer stage driving system 15, thereby adjusting the focus position and inclination angle of the wafer W. Furthermore, the main control system 14 adjusts the X-directional, Y-directional, and rotational positions of the wafer W on the basis of measured values by the wafer laser interferometer 13. Namely, the main control system 14 sends a control signal to the wafer stage driving system 15 to drive the XY stage 10 by the wafer stage driving system 15, thereby adjusting the X-directional, Y-directional, and rotational positions of the wafer W.

During exposure, the main control system 14 sends a control signal to the mechanism incorporated in the reticle stage RST and sends a control signal to the wafer stage driving system 15 to project the pattern image of the reticle R into a predetermined shot area on the wafer W to effect exposure thereof, while driving the reticle stage RST and XY stage 10 at a speed ratio according to the projection magnification of the projection optical system PL. Thereafter, the main control system 14 sends a control signal to the wafer stage driving system 15 to drive the XY stage 10 by the wafer stage driving system 15, thereby stepwise moving another shot area on the wafer W to the exposure position.

In this way, the operation to effect scanning exposure of the pattern image of the reticle R onto the wafer W is repeatedly carried out by the step-and-scan method. Namely, in the present embodiment, while the positions of the reticle R and wafer W are controlled using the wafer stage driving system 15 and the wafer laser interferometer 13 and others, the reticle stage RST and XY stage 10, therefore the reticle R and wafer W, are synchronously moved (scanned) along the shorter-side direction or Y-direction of the rectangular still exposure region and still illumination region, whereby scanning exposure of the reticle pattern is effected in the region having the width equal to the longer side LX of the still exposure region and the length according to the scanning distance (movement distance) of the wafer W, on the wafer W.

Figure 3:
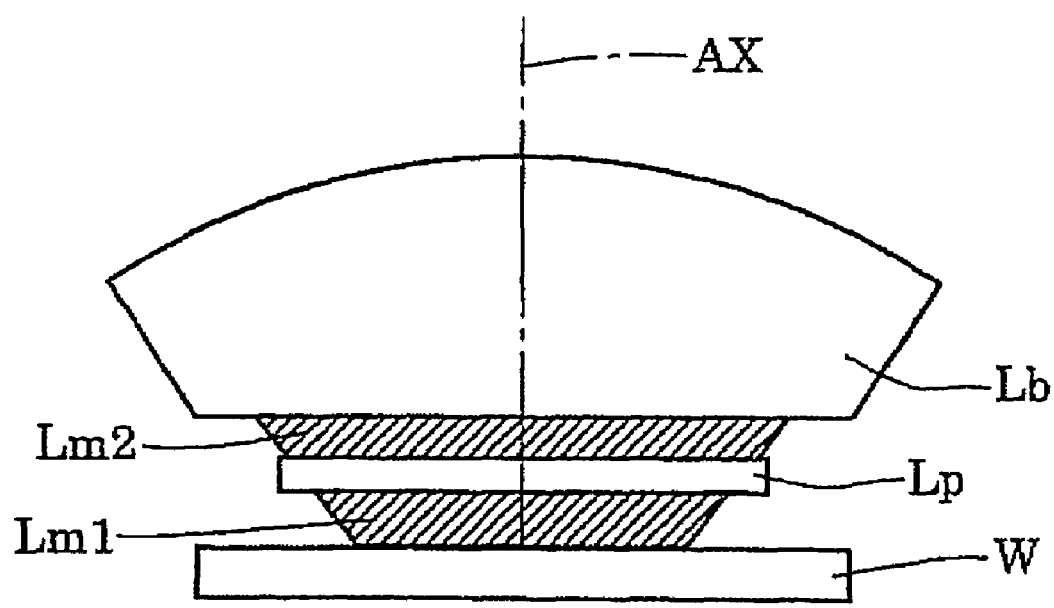
FIG. 3 is a drawing schematically showing a configuration between a boundary lens and a wafer in each example of the embodiment.

FIG. 3 is a drawing schematically showing a configuration between the boundary lens and the wafer in each example of the present embodiment. With reference to FIG. 3, the projection optical system in each example is arranged as follows: the in-liquid plane-parallel plate (first optically transparent member) Lp with the surface on the reticle R side (object side) being in contact with the second liquid Lm2 and with the surface on the wafer W side (image side) being in contact with the first liquid Lm1 is located nearest to the wafer. The boundary lens Lb with the surface on the reticle R side being in contact with gas and with the surface on the wafer W side being in contact with the second liquid Lm2 is arranged as the second optically transparent member adjacent to the in-liquid plane-parallel plate Lp.

In each example, pure water (deionized water) readily available in large volume in a semiconductor manufacturing factory or the like is used as the first liquid Lm1 and the second liquid Lm2 having the refractive index larger than 1.1. The boundary lens Lb is a positive lens a convex surface of which is directed toward the reticle R and a planar shape of which is directed toward the wafer W. Furthermore, the boundary lens Lb and the in-liquid plane-parallel plate Lp both are made of silica.

In the exposure apparatus of the step-and-scan method for effecting scanning exposure with relative movement of the wafer W to the projection optical system PL, the optical path between the boundary lens Lb of the projection optical system PL and the wafer W can be kept as filled with the liquid (Lm1, Lm2) from start to finish of the scanning exposure, for example, by using the technique disclosed in International Publication WO99/49504, the technique disclosed in Japanese Patent Application Laid-Open No. 10-303114, and so on.

The technique disclosed in International Publication WO99/49504 is to supply the liquid controlled at a predetermined temperature, from a liquid supply apparatus through a supply tube and a discharge nozzle so as to fill the optical path between the boundary lens Lb and the wafer W, and to collect the liquid from on the wafer W through a collection tube and an inflow nozzle by the liquid supply apparatus. On the other hand, the technique disclosed in Japanese Patent Application Laid-Open No. 10-303114 is to construct a wafer holder table in such a container shape as to be able to retain the liquid, and to position and hold the wafer W in the center of the inner bottom (in the liquid) by vacuum suction. It is also so arranged that the distal end of the barrel of the projection optical system PL reaches the interior of the liquid and thus the wafer-side optical surface of the boundary lens Lb reaches the interior of the liquid. The teachings of International Publication WO99/49504 and Japanese Patent Application Laid-Open No. 10-303114 are hereby incorporated by reference.

In the present embodiment, as shown in FIG. 1, a first supply/discharge mechanism 21 is used to circulate pure water as the first liquid Lm1 in the optical path between the in-liquid plane-parallel plate Lp and the wafer W. Furthermore, a second supply/discharge mechanism 22 is also used to circulate pure water as the second liquid Lm2 in the optical path between the boundary lens Lb and the in-liquid plane-parallel plate Lp. By circulating the pure water as the immersion liquids at a small flow rate in this manner, it becomes feasible to prevent alteration of the liquids by effects of antisepsis, mold prevention, and so on.

In each example of the present embodiment, an aspherical surface is represented by mathematical formula (a) below, where y represents a height in a direction normal to the optical axis, z a distance (sag) along the optical axis from a tangent plane at a vertex of the aspherical surface to a position on the aspherical surface at a height y, r the radius of curvature at the vertex, κ the conic coefficient, and $C_n$ an aspherical coefficient of nth order. In each example, a lens surface formed in an aspherical shape is provided with mark * on the right side to a surface number.

$$z=(y^2/r)/[1+\{1-(1+\kappa)\cdot y^2/r^2\}^{1/2}]+C_4\cdot y^4+C_6\cdot y^6+C_8\cdot y^8+C_{10}\cdot y^{10}+C_{12}\cdot y^{12}+C_{14}\cdot y^{14}+\ldots \quad (a)$$

First Embodiment

Figure 4:
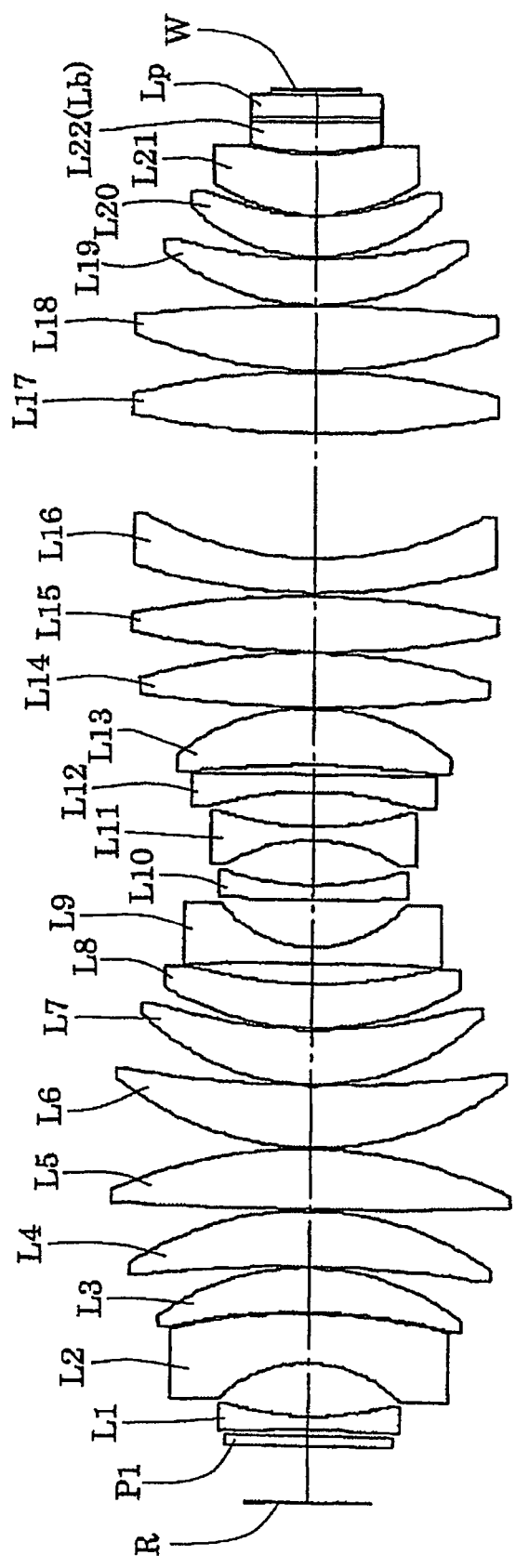
FIG. 4 is a drawing showing a lens configuration of a projection optical system according to a first example of the embodiment.

FIG. 4 is a drawing showing a lens configuration of a projection optical system according to the first example of the present embodiment. With reference to FIG. 4, the projection optical system PL of the first example is composed of the following elements named in order from the reticle side: plane-parallel plate P1, biconcave lens L1 a concave surface of an aspherical shape of which is directed toward the wafer, negative meniscus lens L2 a concave surface of which is directed toward the reticle, positive meniscus lens L3 a concave surface of an aspherical shape of which is directed toward the reticle, positive meniscus lens L4 a concave surface of which is directed toward the reticle, biconvex lens L5, positive meniscus lens L6 a convex surface of which is directed toward the reticle, positive meniscus lens L7 a convex surface of which is directed toward the reticle, positive meniscus lens L8 a concave surface of an aspherical shape of which is directed toward the wafer, biconcave lens L9, negative meniscus lens L10 a convex surface of which is directed toward the reticle, biconcave lens L11 a concave surface of an aspherical shape of which is directed toward the wafer, plano-concave lens L12 a concave surface of an aspherical shape of which is directed toward the reticle, positive meniscus lens L13 a concave surface of an aspherical shape of which is directed toward the reticle, biconvex lens L14, biconvex lens L15, negative meniscus lens L16 a convex surface of which is directed toward the reticle, biconvex lens L17, biconvex lens L18, positive meniscus lens L19 a concave surface of an aspherical shape of which is directed toward the wafer, positive meniscus lens L20 a concave surface of an aspherical shape of which is directed toward the wafer, positive meniscus lens L21 a convex surface of which is directed toward the reticle, plano-convex lens L22 (boundary lens Lb) a planar surface of which is directed toward the wafer, and in-liquid plane-parallel plate Lp.

In the first example, the optical path between the boundary lens Lb and the in-liquid plane-parallel plate Lp and the optical path between the in-liquid plane-parallel plate Lp and the wafer W are filled with pure water (Lm1, Lm2) having the refractive index of 1.435876 for the ArF excimer laser light (wavelength $\lambda$=193.306 nm) as used light (exposure light). All the optically transparent members (P1, L1-L22 (Lb), Lp) are made of silica ($SiO_2$) having the refractive index of 1.5603261 for the used light.

Table (1) below presents values of specifications of the projection optical system PL in the first example. In Table (1), $\lambda$ represents the center wavelength of the exposure light, $\beta$ the magnitude of the projection magnification, NA the image-side (wafer-side) numerical aperture, B the radius of the image circle IF (maximum image height) on the wafer W, LX the length along the X-direction of the still exposure region ER (the length of the longer sides), and LY the length along the Y-direction of the still exposure region ER (the length of the shorter sides). The surface number indicates an order of a surface from the reticle side, r the radius of curvature of each surface (in the case of an aspherical surface, the radius of curvature at the vertex: mm), d an axial distance or surface separation (mm) of each surface, and n the refractive index at the center wavelength. The notation in Table (1) also applies to Table (2) below.

TABLE 1

(PRINCIPAL SPECIFICATIONS)

$\lambda$ = 193.306 nm
$\beta$ = ¼
NA = 1.00
B = 13.4 mm
LX = 26 mm
LY = 5.5 mm

TABLE 1-continued (SPECIFICATIONS OF OPTICAL MEMBERS)

| SURFACE NUMBER | r | d | n | OPTICAL MEMBER |
|---|---|---|---|---|
| (RETICLE SURFACE) |  | 50.000 |  |  |
| 1 | ∞ | 8.000 | 1.5603261 | (P1) |
| 2 | ∞ | 5.225 |  |  |
| 3 | −1943.233 | 12.000 | 1.5603261 | (L1) |
| 4* | 191.125 | 47.012 |  |  |
| 5 | −104.228 | 42.945 | 1.5603261 | (L2) |
| 6 | −470.767 | 1.000 |  |  |
| 7* | −542.622 | 39.860 | 1.5603261 | (L3) |
| 8 | −202.724 | 1.000 |  |  |
| 9 | −1066.606 | 49.498 | 1.5603261 | (L4) |
| 10 | −257.416 | 1.000 |  |  |
| 11 | 2900.000 | 53.600 | 1.5603261 | (L5) |
| 12 | −376.177 | 1.000 |  |  |
| 13 | 254.290 | 54.884 | 1.5603261 | (L6) |
| 14 | 927.490 | 1.000 |  |  |
| 15 | 192.047 | 50.000 | 1.5603261 | (L7) |
| 16 | 405.266 | 1.000 |  |  |
| 17 | 230.501 | 39.859 | 1.5603261 | (L8) |
| 18* | 322.792 | 19.156 |  |  |
| 19 | −2992.366 | 14.004 | 1.5603261 | (L9) |
| 20 | 96.198 | 42.051 |  |  |
| 21 | 1075.262 | 14.000 | 1.5603261 | (L10) |
| 22 | 238.222 | 39.560 |  |  |
| 23 | −133.879 | 12.000 | 1.5603261 | (L11) |
| 24* | 248.570 | 31.009 |  |  |
| 25* | −309.992 | 15.000 | 1.5603261 | (L12) |
| 26 | ∞ | 9.148 |  |  |
| 27* | −737.276 | 51.000 | 1.5603261 | (L13) |
| 28 | −176.320 | 1.000 |  |  |
| 29 | 1040.000 | 48.704 | 1.5603261 | (L14) |
| 30 | −451.186 | 1.000 |  |  |
| 31 | 725.000 | 48.768 | 1.5603261 | (L15) |
| 32 | −697.471 | 3.000 |  |  |
| 33 | 503.559 | 30.048 | 1.5603261 | (L16) |
| 34 | 281.163 | 111.150 |  |  |
| 35 | 724.563 | 54.923 | 1.5603261 | (L17) |
| 36 | −564.358 | 1.000 |  |  |
| 37 | 372.647 | 56.556 | 1.5603261 | (L18) |
| 38 | −1424.995 | 1.000 |  |  |
| 39 | 196.339 | 41.207 | 1.5603261 | (L19) |
| 40* | 498.912 | 1.000 |  |  |
| 41 | 147.694 | 36.513 | 1.5603261 | (L20) |
| 42* | 185.195 | 1.000 |  |  |
| 43 | 147.798 | 52.775 | 1.5603261 | (L21) |
| 44 | 216.307 | 2.256 |  |  |
| 45 | 238.988 | 26.298 | 1.5603261 | (L22: Lb) |
| 46 | ∞ | 3.000 | 1.435876 | (Lm2) |
| 47 | ∞ | 20.000 | 1.5603261 | (Lp) |
| 48 | ∞ | 3.000 | 1.435876 | (Lm1) |

(WAFER SURFACE)
(ASPHERICAL DATA)

4TH SURFACE $\kappa = 0$
$C_4 = -1.48452 \times 10^{-7}$    $C_6 = 5.65923 \times 10^{-12}$
$C_8 = -2.78621 \times 10^{-16}$    $C_{10} = 2.37952 \times 10^{-20}$
$C_{12} = -1.19751 \times 10^{-24}$    $C_{14} = 1.82016 \times 10^{-28}$
$C_{16} = -5.16714 \times 10^{-33}$

7TH SURFACE $\kappa = 0$
$C_4 = -1.27342 \times 10^{-8}$    $C_6 = 2.18802 \times 10^{-13}$
$C_8 = -4.26931 \times 10^{-18}$    $C_{10} = 4.55926 \times 10^{-22}$
$C_{12} = -2.06887 \times 10^{-26}$    $C_{14} = 1.46041 \times 10^{-30}$
$C_{16} = -1.78415 \times 10^{-35}$

18TH SURFACE $\kappa = 0$
$C_4 = -1.79752 \times 10^{-8}$    $C_6 = 1.95237 \times 10^{-14}$
$C_8 = -3.82843 \times 10^{-18}$    $C_{10} = -3.85072 \times 10^{-22}$
$C_{12} = 1.96652 \times 10^{-26}$    $C_{14} = -3.59987 \times 10^{-31}$
$C_{16} = 7.72530 \times 10^{-37}$ TABLE 1-continued

24TH SURFACE $\kappa = 0$
$C_4 = 1.86641 \times 10^{-8}$  $C_6 = -2.48589 \times 10^{-12}$
$C_8 = -3.40085 \times 10^{-17}$  $C_{10} = 1.20901 \times 10^{-20}$
$C_{12} = -4.99726 \times 10^{-25}$  $C_{14} = -4.18254 \times 10^{-29}$
$C_{16} = 2.90453 \times 10^{-33}$

25TH SURFACE $\kappa = 0$
$C_4 = -4.42908 \times 10^{-8}$  $C_6 = 3.24465 \times 10^{-12}$
$C_8 = -2.17933 \times 10^{-18}$  $C_{10} = 3.09914 \times 10^{-21}$
$C_{12} = -5.89781 \times 10^{-25}$  $C_{14} = 1.44812 \times 10^{-28}$
$C_{16} = -9.31891 \times 10^{-33}$

27TH SURFACE $\kappa = 0$
$C_4 = 1.28473 \times 10^{-8}$  $C_6 = -1.52185 \times 10^{-12}$
$C_8 = 3.27024 \times 10^{-17}$  $C_{10} = 2.96321 \times 10^{-21}$
$C_{12} = -3.12141 \times 10^{-25}$  $C_{14} = 1.24069 \times 10^{-29}$
$C_{16} = -3.63752 \times 10^{-35}$

40TH SURFACE $\kappa = 0$
$C_4 = 1.37642 \times 10^{-8}$  $C_6 = 7.52294 \times 10^{-14}$
$C_8 = 8.14751 \times 10^{-18}$  $C_{10} = -2.38664 \times 10^{-22}$
$C_{12} = 1.89052 \times 10^{-26}$  $C_{14} = -5.72857 \times 10^{-31}$
$C_{16} = 1.24235 \times 10^{-35}$

42ND SURFACE $\kappa = 0$
$C_4 = -4.67034 \times 10^{-8}$  $C_6 = -9.90580 \times 10^{-13}$
$C_8 = -5.14638 \times 10^{-18}$  $C_{10} = 1.69872 \times 10^{-21}$
$C_{12} = -1.07534 \times 10^{-25}$  $C_{14} = 5.68180 \times 10^{-30}$
$C_{16} = -1.53908 \times 10^{-34}$ (VALUES CORRESPONDING TO CONDITIONAL EXPRESSIONS)

D1 = 20 mm
M1 = 3 mm
M2 = 3 mm
D2 = 872.443 mm
(1) D1/(M1 + M2) = 3.33
(2) D1/D2 = 0.0229

Figure 5:
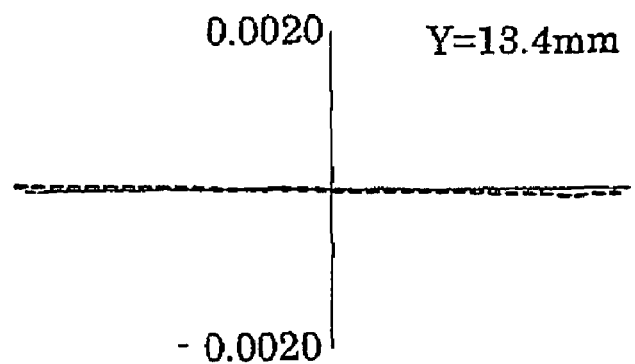
FIG. 5 is a drawing showing transverse aberration in the first example.
Figure 5:
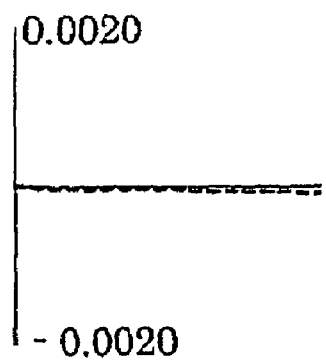
Figure 5:
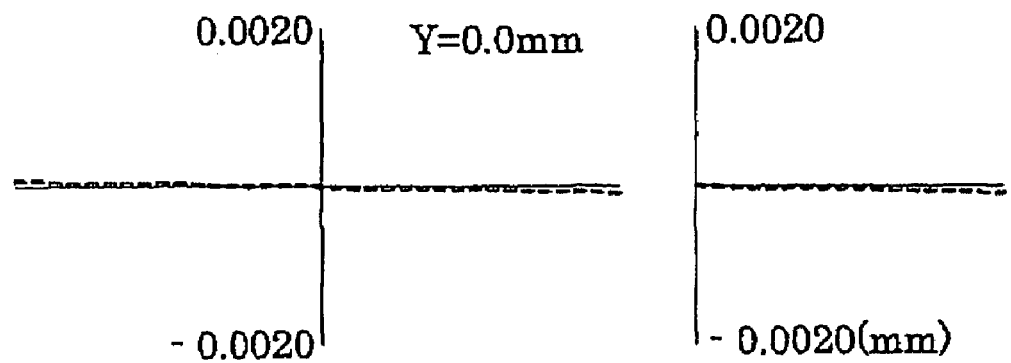

FIG. 5 is a diagram showing the transverse aberration in the first example. In the aberration diagram, Y represents the image height. It is apparent from the aberration diagram of FIG. 5 that in the first example the aberration is well compensated for the excimer laser light having the wavelength of 193.306 nm, while ensuring the very large image-side numerical aperture (NA=1.00) and the relatively large still exposure region ER (26 mm×5.5 mm).

Second Example

Figure 6:
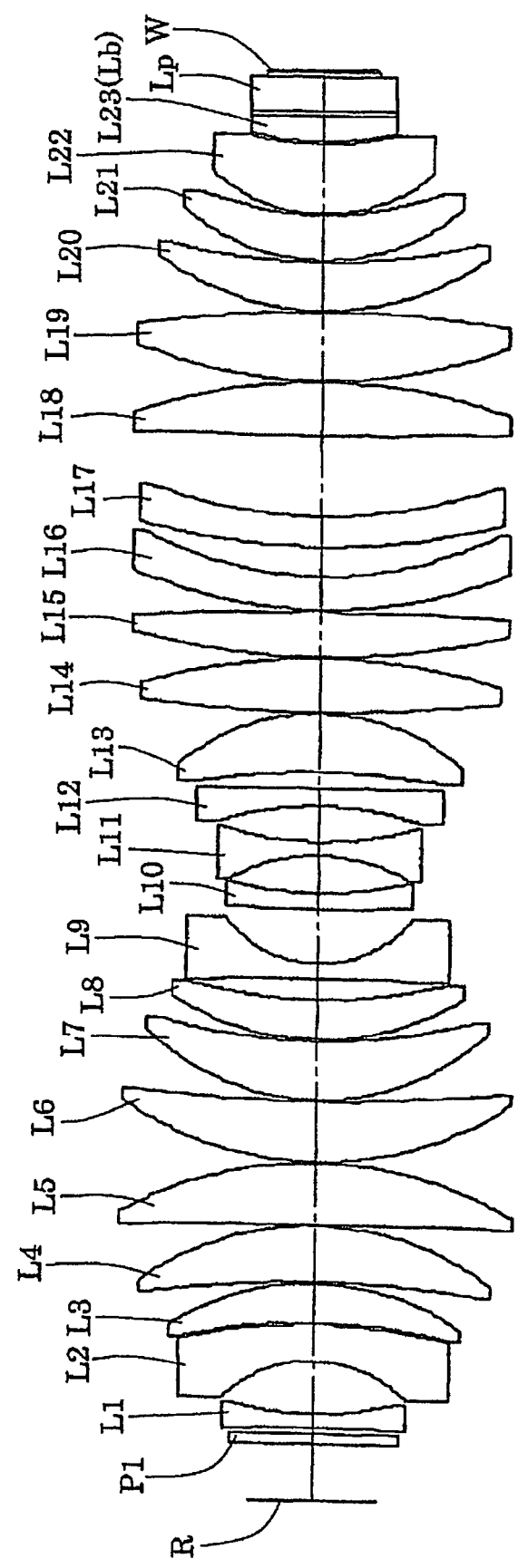
FIG. 6 is a drawing showing a lens configuration of a projection optical system according to a second example of the embodiment.

FIG. 6 is a drawing showing a lens configuration of a projection optical system according to a second example of the present embodiment. With reference to FIG. 6, the projection optical system PL of the second example is composed of the following elements named in order from the reticle side: plane-parallel plate P1, biconcave lens L1 a concave surface of an aspherical shape of which is directed toward the wafer, negative meniscus lens L2 a concave surface of which is directed toward the reticle, positive meniscus lens L3 a concave surface of an aspherical shape of which is directed toward the reticle, positive meniscus lens L4 a concave surface of which is directed toward the reticle, positive meniscus lens L5 a concave surface of which is directed toward the reticle, positive meniscus lens L6 a convex surface of which is directed toward the reticle, positive meniscus lens L7 a convex surface of which is directed toward the reticle, positive meniscus lens L8 a concave surface of which is directed toward the wafer, biconcave lens L9, negative meniscus lens L10 a convex surface of which is directed toward the reticle, biconcave lens L11 a concave surface of an aspherical shape of which is directed toward the wafer, plano-concave lens L12 a concave surface of an aspherical shape of which is directed toward the reticle, positive meniscus lens L13 a concave surface of an aspherical shape of which is directed toward the reticle, biconvex lens L14, biconvex lens L15, negative meniscus lens L16 a convex surface of which is directed toward the reticle, negative meniscus lens L17 a convex surface of which is directed toward the reticle, biconvex lens L18, biconvex lens L19, positive meniscus lens L20 a concave surface of an aspherical shape of which is directed toward the wafer, positive meniscus lens L21 a concave surface of an aspherical shape of which is directed toward the wafer, positive meniscus lens L22 a convex surface of which is directed toward the reticle, plano-convex lens L23 (boundary lens Lb) a planar surface of which is directed toward the wafer, and in-liquid plane-parallel plate Lp.

In the second example, just as in the first example, the optical path between the boundary lens Lb and the in-liquid plane-parallel plate Lp and the optical path between the in-liquid plane-parallel plate Lp and the wafer W are also filled with pure water (Lm1, Lm2) having the refractive index of 1.435876 for the ArF excimer laser light (wavelength λ=193.306 nm) as used light (exposure light). All the optically transparent members (P1, L1-L23 (Lb), Lp) are made of silica (SiO$_2$) having the refractive index of 1.5603261 for the used light. Table (2) below presents values of specifications of the projection optical system PL in the second example.

TABLE 2

(PRINCIPAL SPECIFICATIONS)

λ = 193.306 nm
β = ¼
NA = 1.00
B = 13.4 mm
LX = 26 mm
LY = 5.5 mm (SPECIFICATIONS OF OPTICAL MEMBERS)

| SURFACE NUMBER | r | d | n | OPTICAL MEMBER |
|---|---|---|---|---|
| (RETICLE SURFACE) | | 50.000 | | |
| 1 | ∞ | 8.000 | 1.5603261 | (P1) |
| 2 | ∞ | 5.813 | | |
| 3 | −1313.588 | 12.000 | 1.5603261 | (L1) |
| 4* | 194.350 | 47.515 | | |
| 5 | −102.611 | 31.592 | 1.5603261 | (L2) |
| 6 | −461.005 | 1.000 | | |
| 7* | −572.289 | 35.000 | 1.5603261 | (L3) |
| 8 | −205.453 | 1.000 | | |
| 9 | −861.765 | 49.045 | 1.5603261 | (L4) |
| 10 | −234.264 | 1.000 | | |
| 11 | −7543.720 | 53.500 | 1.5603261 | (L5) |
| 12 | −309.987 | 1.000 | | |
| 13 | 269.626 | 53.500 | 1.5603261 | (L6) |
| 14 | 1360.614 | 1.000 | | |
| 15 | 192.801 | 51.692 | 1.5603261 | (L7) |
| 16 | 461.837 | 1.000 | | |
| 17 | 210.454 | 35.000 | 1.5603261 | (L8) |
| 18* | 321.530 | 19.097 | | |
| 19 | −3000.000 | 14.000 | 1.5603261 | (L9) |
| 20 | 95.000 | 48.480 | | |
| 21 | 3164.412 | 14.000 | 1.5603261 | (L10) |
| 22 | 300.855 | 32.967 | | |
| 23 | −139.522 | 12.000 | 1.5603261 | (L11) |
| 24* | 257.218 | 31.705 | | |
| 25* | −271.930 | 15.000 | 1.5603261 | (L12) |
| 26 | ∞ | 14.684 | | |

TABLE 2-continued

| | | | | |
|---|---|---|---|---|
| 27* | −558.516 | 52.500 | 1.5603261 | (L13) |
| 28 | −170.429 | 1.000 | | |
| 29 | 1071.642 | 47.720 | 1.5603261 | (L14) |
| 30 | −480.838 | 1.000 | | |
| 31 | 571.551 | 40.000 | 1.5603261 | (L15) |
| 32 | −2616.268 | 1.000 | | |
| 33 | 371.140 | 29.000 | 1.5603261 | (L16) |
| 34 | 295.486 | 26.280 | | |
| 35 | 542.767 | 27.000 | 1.5603261 | (L17) |
| 36 | 384.788 | 71.827 | | |
| 37 | 5451.649 | 45.500 | 1.5603261 | (L18) |
| 38 | −444.611 | 1.000 | | |
| 39 | 399.708 | 60.000 | 1.5603261 | (L19) |
| 40 | −981.762 | 1.000 | | |
| 41 | 221.630 | 42.003 | 1.5603261 | (L20) |
| 42* | 588.751 | 1.000 | | |
| 43 | 166.092 | 39.552 | 1.5603261 | (L21) |
| 44* | 220.835 | 1.000 | | |
| 45 | 131.370 | 60.495 | 1.5603261 | (L22) |
| 46 | 225.941 | 2.550 | | |
| 47 | 255.976 | 21.994 | 1.5603261 | (L23: Lb) |
| 48 | ∞ | 3.000 | 1.435876 | (Lm2) |
| 49 | ∞ | 30.000 | 1.5603261 | (Lp) |
| 50 | ∞ | 3.000 | 1.435876 | (Lm1) |

(WAFER SURFACE)
(ASPHERICAL DATA)

4TH SURFACE $\kappa = 0$
$C_4 = -1.50211 \times 10^{-7}$    $C_6 = 5.93396 \times 10^{-12}$
$C_8 = -3.03095 \times 10^{-16}$    $C_{10} = 2.68639 \times 10^{-20}$
$C_{12} = -1.17605 \times 10^{-24}$    $C_{14} = 1.62932 \times 10^{-28}$

7TH SURFACE $\kappa = 0$
$C_4 = -2.07418 \times 10^{-8}$    $C_6 = 3.83376 \times 10^{-13}$
$C_8 = -1.13755 \times 10^{-17}$    $C_{10} = 8.91400 \times 10^{-22}$
$C_{12} = -3.49165 \times 10^{-26}$    $C_{14} = 2.22125 \times 10^{-30}$

18TH SURFACE $\kappa = 0$
$C_4 = -2.15175 \times 10^{-8}$    $C_6 = -1.27224 \times 10^{-14}$
$C_8 = 2.89183 \times 10^{-18}$    $C_{10} = -3.03644 \times 10^{-22}$
$C_{12} = 4.28894 \times 10^{-27}$    $C_{14} = 1.27798 \times 10^{-31}$

24TH SURFACE $\kappa = 0$
$C_4 = 2.41720 \times 10^{-8}$    $C_6 = -2.59021 \times 10^{-12}$
$C_8 = -4.25471 \times 10^{-17}$    $C_{10} = 1.28068 \times 10^{-20}$
$C_{12} = -9.51911 \times 10^{-25}$    $C_{14} = 2.09442 \times 10^{-29}$

25TH SURFACE $\kappa = 0$
$C_4 = -3.94203 \times 10^{-8}$    $C_6 = 1.98694 \times 10^{-12}$
$C_8 = 4.69183 \times 10^{-17}$    $C_{10} = -1.80060 \times 10^{-21}$
$C_{12} = 8.68172 \times 10^{-25}$    $C_{14} = -4.07478 \times 10^{-29}$

27TH SURFACE $\kappa = 0$
$C_4 = 7.76883 \times 10^{-9}$    $C_6 = -7.21115 \times 10^{-13}$
$C_8 = 7.51516 \times 10^{-18}$    $C_{10} = 1.51795 \times 10^{-21}$
$C_{12} = -1.13337 \times 10^{-25}$    $C_{14} = 4.93479 \times 10^{-30}$

42ND SURFACE $\kappa = 0$
$C_4 = 7.50906 \times 10^{-9}$    $C_6 = 1.73963 \times 10^{-13}$
$C_8 = -2.17575 \times 10^{-18}$    $C_{10} = 1.51141 \times 10^{-22}$
$C_{12} = -2.78123 \times 10^{-27}$    $C_{14} = 5.19893 \times 10^{-32}$

44TH SURFACE $\kappa = 0$
$C_4 = -3.36423 \times 10^{-8}$    $C_6 = -7.98951 \times 10^{-13}$
$C_8 = 1.82312 \times 10^{-17}$    $C_{10} = 3.85596 \times 10^{-22}$
$C_{12} = -1.86813 \times 10^{-26}$    $C_{14} = 1.11783 \times 10^{-31}$ TABLE 2-continued (VALUES CORRESPONDING TO CONDITIONAL EXPRESSIONS)

D1 = 30 mm
M1 = 3 mm
M2 = 3 mm
D2 = 880.093 mm
(1)D1/(M1 + M2) = 5
(2)D1/D2 = 0.0341

Figure 7:
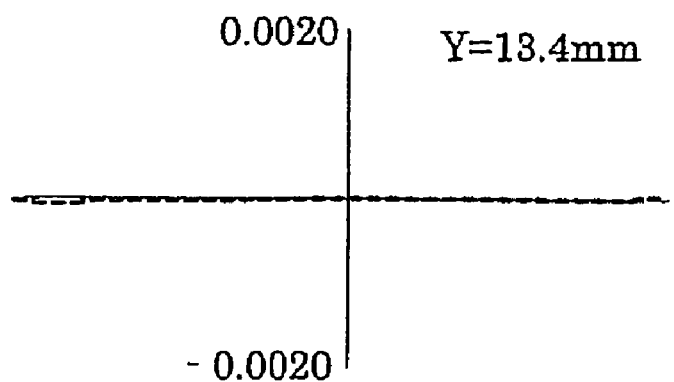
FIG. 7 is a drawing showing transverse aberration in the second example.
Figure 7:
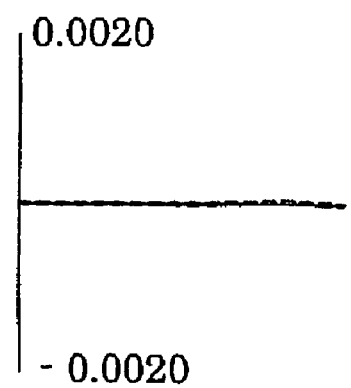
Figure 7:
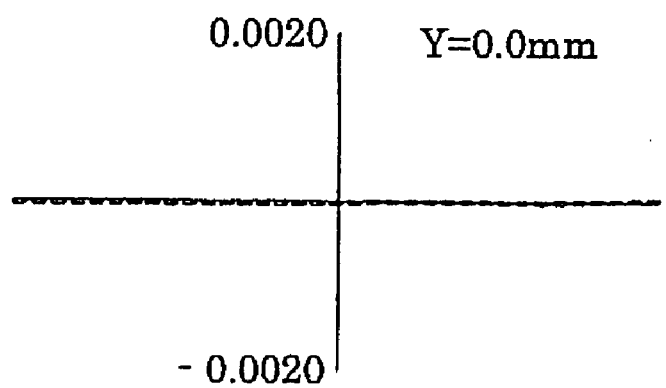

FIG. 7 is a diagram showing the transverse aberration in the second example. In the aberration diagram, Y represents the image height. It is apparent from the aberration diagram of FIG. 7 that in the second example, just as in the first example, the aberration is also well compensated for the excimer laser light having the wavelength of 193.306 nm, while ensuring the very large image-side numerical aperture (NA=1.00) and the relatively large still exposure region ER (26 mm×5.5 mm).

In each example, as described above, the projection optical system ensures the high image-side numerical aperture of 1.00 for the ArF excimer laser light having the wavelength of 193.306 nm and ensures the effective exposure region (still exposure region) ER in the rectangular shape of 26 mm×5.5 mm, and is thus able to implement scanning exposure of a circuit pattern in a high resolution in the rectangular exposure region, for example, of 26 mm×33 mm.

In each example, the in-liquid plane-parallel plate Lp is located in the optical path between the boundary lens Lb and the wafer W, and therefore, even if the pure water as the immersion liquid is contaminated with the photoresist or the like laid on the wafer W, contamination of the image-side optical surface of the boundary lens Lb by the contaminated pure water can be effectively prevented by the in-liquid plane-parallel plate Lp interposed between the boundary lens Lb and the wafer W. Furthermore, in each example the center thickness D1 of the in-liquid plane-parallel plate Lp is set in the appropriate range to satisfy Conditional Expressions (1) and (2), whereby degradation of imaging performance of the projection optical system PL can be substantially avoided on the occasion of replacement of the in-liquid plane-parallel plate Lp as considerably contaminated, while ensuring sufficiently high laser resistance of the boundary lens Lb.

Figure 8:
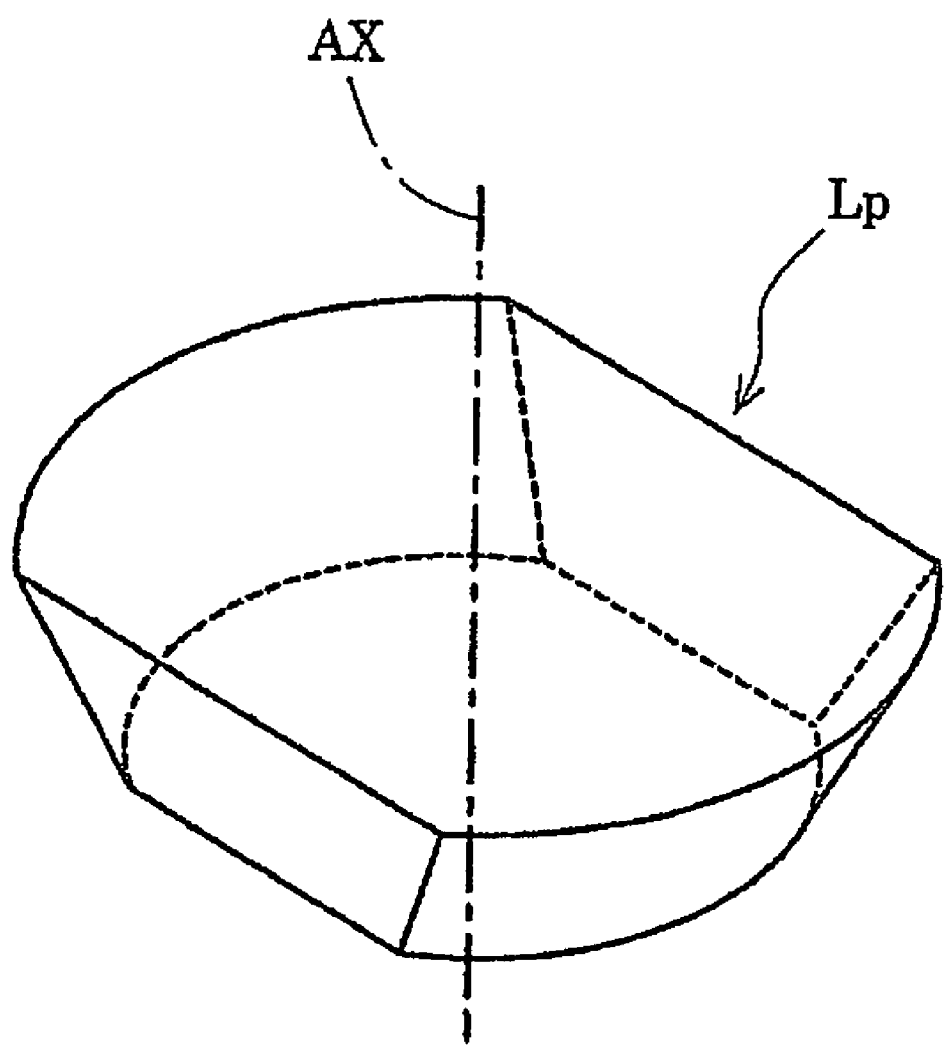
FIG. 8 is a drawing showing an example in which a side face of an in-liquid plane-parallel plate is formed in such a shape as to have a portion of a pyramidal (conical) shape an apex of which is directed toward a wafer.

In the aforementioned embodiment, as shown in FIG. 8, the side face of the in-liquid plane-parallel plate Lp is preferably formed in such a shape as to have a portion of a conical or pyramidal shape an apex of which is directed toward the wafer W. In other words, since in the present embodiment the reticle pattern image is formed in the still exposure region of the rectangular shape (e.g., 26 mm×5.5 mm) on the wafer W, the effective region of the in-liquid plane-parallel plate Lp is nearly oval, and thus the in-liquid plane-parallel plate Lp is preferably provided with the contour shape obtained by eliminating regions where no effective imaging ray to reach the still exposure region passes (=regions outside the effective region).

When the in-liquid plane-parallel plate Lp is provided with the contour shape as shown in FIG. 8, it becomes feasible to locate the supply/discharge nozzles in the first supply/discharge mechanism 21 as the local liquid immersion mechanism shown in FIG. 1, closer to the exposure region, whereby the local liquid immersion region (the region to be filled with pure water (liquid) between the boundary lens Lb and the in-liquid plane-parallel plate Lp) can be made smaller. This can achieve compactification of the wafer stage. Namely, in order to implement exposure in the marginal region of the wafer (edge shot exposure), the region around the wafer, and the wafer need to be flattened so as to be flush with each other, and the size of the flattened region becomes smaller and the wafer stage also becomes smaller, with decrease in the size of the local liquid immersion region. A configuration with a flat portion around the wafer is disclosed, for example, in International Publication WO2004/053955 and the corresponding U.S. Patent Publication No. 2005/0259234A. The teachings of U.S. Patent Publication No. 2005/0259234A are hereby incorporated by reference.

The exposure apparatus of the above embodiment can be used to manufacture microdevices (semiconductor devices, image pickup devices, liquid-crystal display devices, thin-film magnetic heads, etc.) by illuminating a reticle (mask) by the illumination apparatus (illumination step) and projecting a pattern to be transferred, formed in the mask, onto a photosensitive substrate by the projection optical system (exposure step). An example of a technique of forming a predetermined circuit pattern in a wafer or the like as a photosensitive substrate with the exposure apparatus of the present embodiment to obtain semiconductor devices as microdevices will be described below with reference to the flowchart of FIG. 9.

Figure 9:
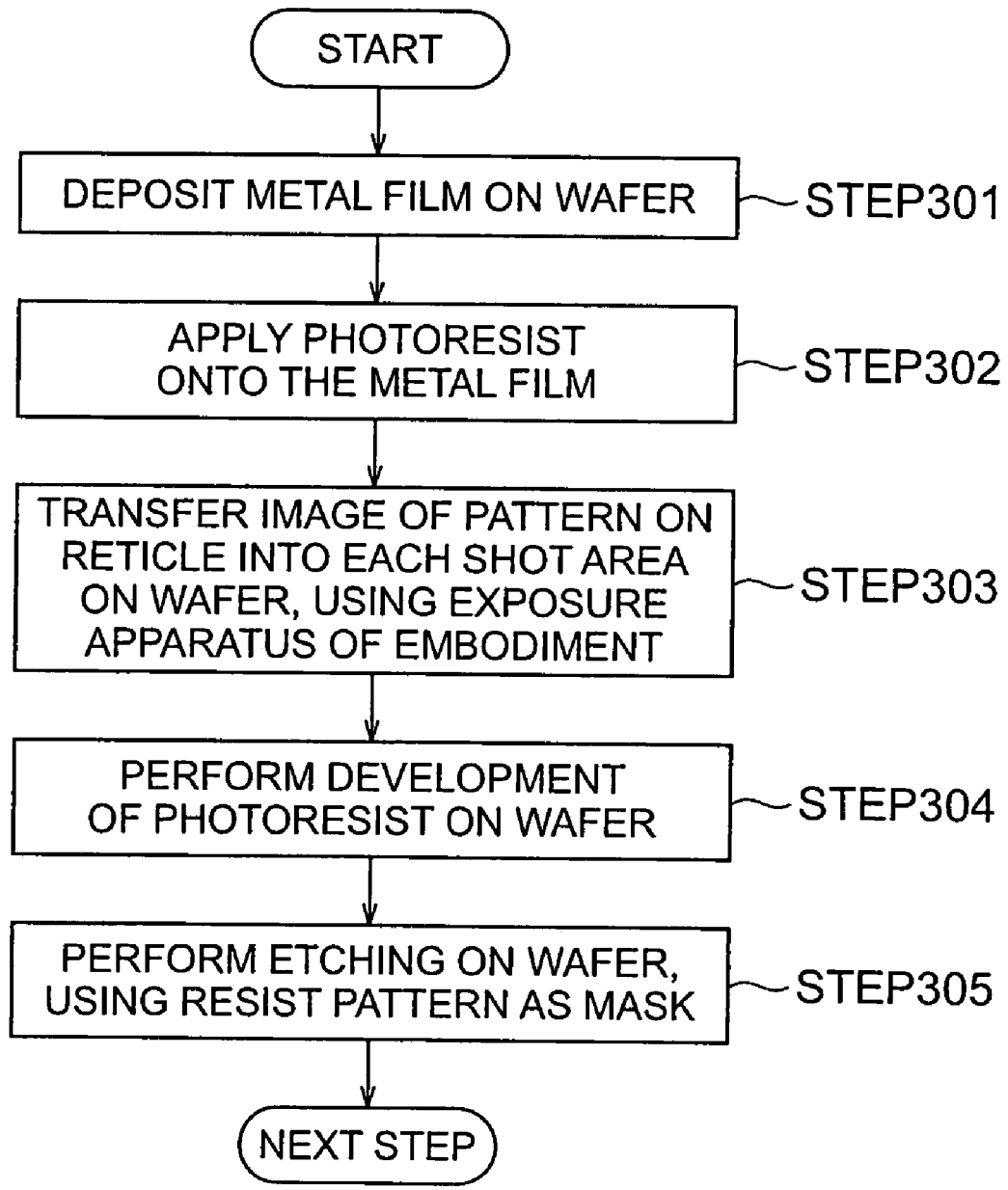
FIG. 9 is a flowchart of a technique of manufacturing semiconductor devices as microdevices.

The first block 301 in FIG. 9 is to deposit a metal film on each wafer in one lot. The next block 302 is to apply a photoresist onto the metal film on each wafer in the lot. The subsequent block 303 is to sequentially transfer an image of a pattern on the mask into each shot area on each wafer in the lot through the projection optical system, using the exposure apparatus of the foregoing embodiment. The subsequent block 304 is to perform development of the photoresist on each wafer in the lot and the subsequent block 305 is to perform etching on each wafer in the lot, using the resist pattern as a mask, and thereby to form a circuit pattern corresponding to the pattern on the mask, in each shot area on each wafer.

Subsequent blocks include formation of circuit patterns in upper layers, and others, thereby manufacturing devices such as semiconductor devices. The above-described semiconductor device manufacturing method permits us to obtain semiconductor devices with extremely fine circuit patterns at high throughput. It is needless to mention that blocks 301 to 305 are arranged to perform the blocks of depositing the metal on the wafer, applying the resist onto the metal film, and performing the exposure, development, and etching and that it is also possible to adopt a process of first forming an oxide film of silicon on the wafer, prior to these blocks, and then executing each of the blocks of applying the resist onto the oxide film of silicon and performing the exposure, development, etching, and so on.

Figure 10:
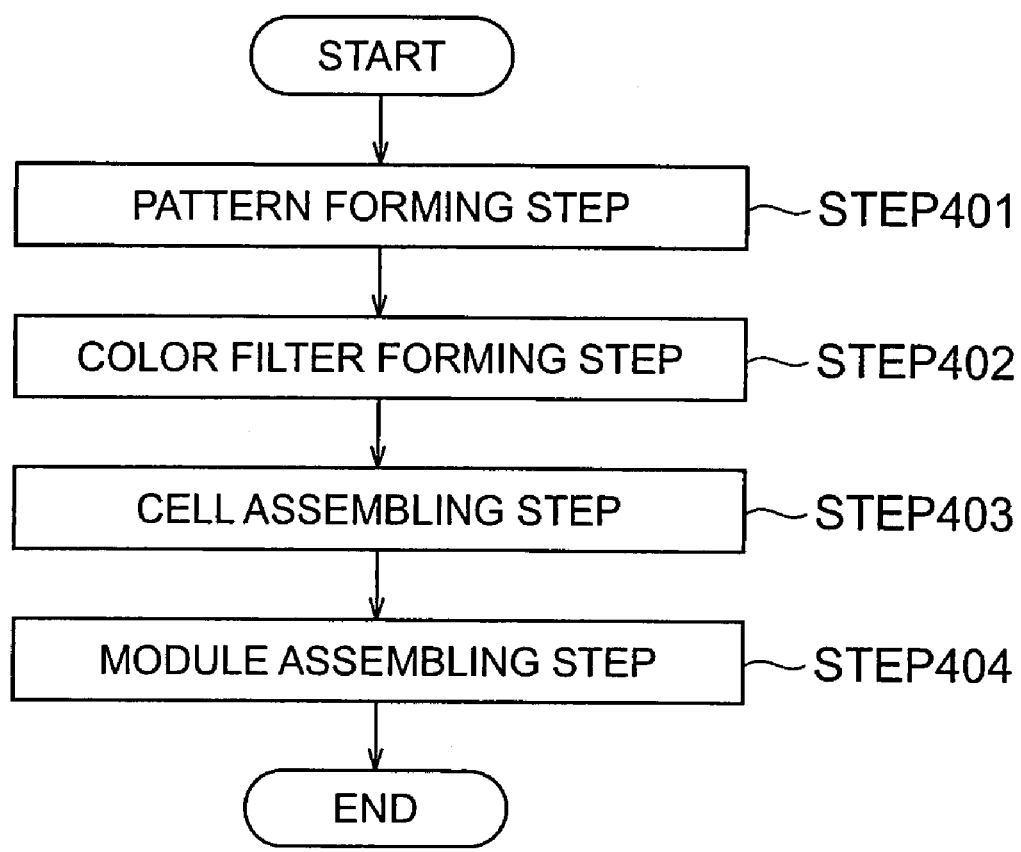
FIG. 10 is a flowchart of a technique of manufacturing a liquid-crystal display device as a microdevice.

The exposure apparatus of the present embodiment can also be used to manufacture a liquid-crystal display device as a microdevice by forming predetermined patterns (circuit pattern, electrode pattern, etc.) on plates (glass substrates). An example of a technique in this case will be described with reference to the flowchart of FIG. 10. In FIG. 10, a pattern forming block 401 is to execute a so-called photolithography block to transfer a pattern of a mask onto a photosensitive substrate (glass substrate coated with a resist, or the like), using the exposure apparatus of the present embodiment. This photolithography block results in forming the predetermined pattern including a number of electrodes and others on the photosensitive substrate. Thereafter, the exposed substrate is subjected to each of blocks such as development, etching, and resist removal, whereby a predetermined pattern is formed on the substrate. Thereafter, the process shifts to the next color filter forming block 402.

The next color filter forming block 402 is to form a color filter in which a number of sets of three dots corresponding to R (Red), G (Green), and B (Blue) are arrayed in a matrix pattern, or in which sets of three stripe filters of R, G, and B are arrayed as a plurality of lines along the horizontal scan line direction. After completion of the color filter forming block 402, a cell assembling block 403 is carried out. The cell assembling block 403 is to assemble a liquid crystal panel (liquid crystal cell), using the substrate with the predetermined pattern obtained in the pattern forming block 401, the color filter obtained in the color filter forming block 402, and so on.

In the cell assembling block 403, for example, a liquid crystal is poured into between the substrate with the predetermined pattern obtained in the pattern forming block 401 and the color filter obtained in the color filter forming block 402, to manufacture a liquid crystal panel (liquid crystal cell). The subsequent module assembling block 404 is to install each of components such as an electric circuit, a backlight, etc. for display operation of the assembled liquid crystal panel (liquid crystal cell) to complete the liquid-crystal display device. The above-described method of manufacturing the liquid-crystal display device permits us to obtain the liquid-crystal display device with an extremely fine circuit pattern at high throughput.

The aforementioned embodiment was arranged to use the ArF excimer laser light source, but, without having to be limited to this, another appropriate light source is also applicable, for example, like an $F_2$ laser light source. However, when the $F_2$ laser light is used as the exposure light, the liquid to be used is a fluorine-based liquid, e.g., fluorine oil or perfluoropolyether (PFPE), capable of transmitting the $F_2$ laser light. When the light source used is one to supply light in the vacuum ultraviolet region of wavelengths of not more than 160 nm as described above, the optical material forming the projection optical system is made of a crystalline material, e.g., fluorite, and the boundary lens Lb and the in-liquid plane-parallel plate Lp are also made of a crystalline material. Even in the case where such a crystalline material is used for the first and second optically transparent members, the lower limit of Conditional Expression (1) and the lower limit of Conditional Expression (2) are also useful in terms of preventing concentration of light on the boundary lens Lb and reducing degradation of imaging performance due to heat generation.

The foregoing embodiment was the application of the present invention to the entire refraction type projection optical system wherein all the optical members of the projection optical system were refracting optical members, but, without having to be limited to this, the present invention can also be applied to the catadioptric projection optical systems as described, for example, in International Publication WO2004/107011 and the corresponding U.S. Patent Publication No. 2006/0121364A, International Publication WO2004/019128, International Publication WO2005/059617, International Publication WO2005/069055, and so on. The teachings of U.S. Patent Publication No. 2006/0121364A, International Publication WO2004/019128, International Publication WO2005/059617, and International Publication WO2005/069055 are hereby incorporated by reference.

The aforementioned embodiment was the application of the present invention to the liquid immersion type projection optical system mounted in the exposure apparatus, but, without having to be limited to this, the present invention can also be applied to other general liquid immersion type projection optical systems. The present invention is also applicable to optical systems such as an objective optical system of a liquid immersion microscope.

In the foregoing embodiment the boundary lens Lb and the in-liquid plane-parallel plate Lp were made of silica, but the materials for forming the boundary lens Lb and the in-liquid plane-parallel plate Lp do not always have to be limited to silica; for example, other crystalline materials may be used, e.g., magnesium oxide, calcium oxide, strontium oxide, barium oxide, and so on. In cases where crystalline materials with high optical absorptance are used among such crystalline materials, the lower limit of Conditional Expression (1) and the lower limit of Conditional Expression (2) are also effective in terms of preventing concentration of light on the boundary lens Lb and reducing degradation of imaging performance due to heat generation.

The aforementioned embodiment used the pure water as the first liquid and the second liquid, but the first and second liquids are not limited to the pure water; for example, it is possible to use any liquid with the refractive index of not less than 1.6 for the used wavelength, such as water containing $H^+$, $Cs^+$, $K^+$, $Cl^-$, $SO_4^{2-}$, or $PO_4^{2-}$, isopropanol, glycerol, hexane, heptane, or decane. When such a liquid with the refractive index of not less than 1.6 for the used wavelength is used, the first and second optically transparent members are preferably made of an optical material with the refractive index of not less than 1.6 for the used wavelength. Examples of the optical materials with the refractive index of not less than 1.6 for the used wavelength include CaO (calcium oxide), MgO (magnesium oxide), quartz ($SiO_2$ crystal), sapphire ($\alpha$-alumina crystal), spinel, garnet, and so on.

In the projection optical system of the embodiment, the liquid like pure water is interposed in the optical path between the boundary lens as the second optically transparent member and the image plane (wafer in the case of exposure apparatus), and therefore the projection optical system is able to secure a relatively large effective imaging region while ensuring a large effective image-side numerical aperture. Since the first optically transparent member like a plane-parallel plate is located in the optical path between the boundary lens and the image plane, the projection optical system is able to effectively prevent the contamination of the image-side optical surface of the boundary lens due to the contaminated liquid. Furthermore, since the center thickness of the first optically transparent member is set in the appropriate range, it is feasible to substantially avoid the degradation of imaging performance of the projection optical system on the occasion of replacement of the first optically transparent member as considerably contaminated, while ensuring sufficiently high laser resistance of the boundary lens.

In this manner, the embodiment successfully realizes the liquid immersion type projection optical system permitting replacement of the in-liquid plane-parallel plate without substantial degradation of imaging performance, while ensuring sufficiently high laser resistance of the boundary lens. Therefore, the exposure apparatus and exposure method of the embodiment are able to achieve highly accurate and stable projection exposure of a fine pattern and thus manufacture good microdevices in a highly accurate and stable manner, using the high-resolution liquid-immersion-type projection optical system with the large image-side numerical aperture permitting replacement of the in-liquid plane-parallel plate.

The invention claimed is:

1. An imaging optical system that make a first plane optically conjugate with a second plane, comprising:
   a first optically transparent member located nearest to the second plane, and a second optically transparent member located adjacent to the first optically transparent member,
   wherein an optical path between the first optically transparent member and the second plane is fillable with a first liquid, and wherein an optical path between the first optically transparent member and the second optically transparent member is fillable with a second liquid,
   the imaging optical system satisfying the following conditions:

$1<D1/(M1+M2)<20$, and $0.007<D1/D2<0.05$, where D1 is a center thickness of the first optically transparent member, M1 is a center thickness of a layer of the first liquid, M2 is a center thickness of a layer of the second liquid, and D2 is a sum of center thicknesses of all optically transparent members in the imaging optical system.

2. An imaging optical system according to claim 1, wherein the first liquid and the second liquid are a same liquid.

3. An imaging optical system according to claim 1, wherein the second optically transparent member is a positive lens made of an amorphous material.

4. An imaging optical system according to claim 3, wherein the second optically transparent member is the positive lens made of silica.

5. An imaging optical system according to claim 1, wherein an optical surface on the second plane side of the second optically transparent member is formed in a planar shape.

6. An imaging optical system according to claim 1, wherein the first optically transparent member is a plane-parallel plate made of an amorphous material.

7. An imaging optical system according to claim 6, wherein the first optically transparent member is the plane-parallel plate made of silica.

8. An imaging optical system according to claim 1, wherein a shape of a side face of the first optically transparent member has a portion of a conical or pyramidal shape an apex of which is directed toward the second plane.

9. An imaging optical system according to claim 1, wherein a numerical aperture on the second plane side is not less than 1.

10. An imaging optical system according to claim 9, the imaging optical system forming the image of the first plane on the second plane on the basis of light of a predetermined wavelength,
   wherein, when a refractive index of a gas at the predetermined wavelength in an optical path of the imaging optical system is 1, the first liquid has a refractive index larger than 1.1 at the predetermined wavelength, and the second liquid has a refractive index larger than 1.1 at the predetermined wavelength.

11. An imaging optical system according to claim 1, wherein the first optically transparent member is retractable from the imaging optical system.

12. An imaging optical system according to claim 1, including a projection optical system that projects an image of the first plane onto the second plane.

13. An exposure apparatus comprising the projection optical system as defined in claim 12, for projecting an image of a predetermined pattern set on the first plane, onto a photosensitive substrate set on the second plane.

14. An exposure method comprising:
setting a predetermined pattern on the first plane; and
projecting an image of the pattern onto a photosensitive substrate set on the second plane, through the projection optical system as defined in claim 12, to effect exposure thereof.

15. An exposure method according to claim 14, further comprising replacing the first optically transparent member with another first optically transparent member.

16. A device manufacturing method comprising setting a predetermined pattern on the first plane; projecting an image of the pattern onto a photosensitive substrate set on the second plane, through the projection optical system as defined in claim 12, to effect exposure thereof and developing the photosensitive substrate subjected to the exposure in the exposure step.

17. A device manufacturing method according to claim 16, further comprising replacing the first optically transparent member with another first optically transparent member.

18. An imaging optical system that make a first plane optically conjugate with a second plane, comprising:
a first optically transparent member located nearest to the second plane, and a second optically transparent member located adjacent to the first optically transparent member,
wherein an optical path between the first optically transparent member and the second plane is fillable with a first liquid, and wherein an optical path between the first optically transparent member and the second optically transparent member is fillable with a second liquid,
the imaging optical system satisfying the following condition:

$0.007 < D1/D2 < 0.05$, where D1 is a center thickness of the first optically transparent member, and D2 is a sum of center thicknesses of all optically transparent members in the projection optical system.

19. An imaging optical system according to claim 18, wherein the first liquid and the second liquid are a same liquid.

20. An imaging optical system according to claim 18, wherein the second optically transparent member is a positive lens made of an amorphous material.

21. An imaging optical system according to claim 20, wherein the second optically transparent member is the positive lens made of silica.

22. An imaging optical system according to claim 18, wherein an optical surface on the second plane side of the second optically transparent member is formed in a planar shape.

23. An imaging optical system according to claim 18, wherein the first optically transparent member is a plane-parallel plate made of an amorphous material.

24. An imaging optical system according to claim 23, wherein the first optically transparent member is the plane-parallel plate made of silica.

25. An imaging optical system according to claim 18, wherein a shape of a side face of the first optically transparent member has a portion of a conical or pyramidal shape an apex of which is directed toward the second plane.

26. An imaging optical system according to claim 18, wherein a numerical aperture on the second plane side is not less than 1.

27. An imaging optical system according to claim 26, the imaging optical system forming the image of the first plane on the second plane on the basis of light of a predetermined wavelength,
wherein, when a refractive index of a gas at the predetermined wavelength in an optical path of the imaging optical system is 1, the first liquid has a refractive index larger than 1.1 at the predetermined wavelength, and the second liquid has a refractive index larger than 1.1 at the predetermined wavelength.

28. An imaging optical system according to claim 18, wherein the first optically transparent member is retractable from the imaging optical system.

29. An imaging optical system according to claim 18, including a projection optical system that projects an image of the first plane onto the second plane.

30. An exposure apparatus comprising the projection optical system as defined in claim 29, for projecting an image of a predetermined pattern set on the first plane, onto a photosensitive substrate set on the second plane.

31. An exposure method comprising:
setting a predetermined pattern on the first plane; and
projecting an image of the pattern onto a photosensitive substrate set on the second plane, through the projection optical system as defined in claim 29, to effect exposure thereof.

32. An exposure method according to claim 31, further comprising replacing the first optically transparent member with another first optically transparent member.

33. A device manufacturing method comprising setting a predetermined pattern on the first plane; projecting an image of the pattern onto a photosensitive substrate set on the second plane, through the projection optical system as defined in claim 29, to effect exposure thereof; and
developing the photosensitive substrate subjected to the exposure in the exposure step.

34. A device manufacturing method according to claim 33, further comprising replacing the first optically transparent member with another first optically transparent member.

35. An optically transparent member used in a projection optical system for projecting an image of a first plane onto a second plane and located nearest to the second plane,
wherein an optical path on the second plane side of the optically transparent member is fillable with a first liquid, and an optical path on the first plane side of the optically transparent member is fillable with a second liquid,
the optically transparent member satisfying the following conditions:

$1 < D1/(M1+M2) < 20$, and $0.007 < D1/D2 < 0.05$.

where D1 is a center thickness of the optically transparent member, M1 is a center thickness of a layer of the first liquid, M2 is a center thickness of a layer of the second liquid, and D2 is a sum of center thicknesses of all optically transparent members in the projection optical system.

36. An optically transparent member according to claim 35, wherein the first liquid and the second liquid are a same liquid.

37. An optically transparent member according to claim 35, the optically transparent member being a plane-parallel plate made of an amorphous material.

38. An optically transparent member according to claim 37, wherein the amorphous material is silica.

39. An optically transparent member according to claim 35, wherein a shape of a side face of the optically transparent member has a portion of a conical or pyramidal shape an apex of which is directed toward the second plane.

40. A method of replacing an optical member of a projection optical system for projecting an image of a first plane onto a second plane the method comprising:

replacing an optically transparent member located nearest to the second plane out of the optical members of the projection optical system, with another optically transparent member, and filling an optical path on the second plane side of the optically transparent member and an optical path on the first plane side of the optically transparent member respectively with a first liquid and a second liquid, the replacement method satisfying the following conditions:

$1 < D1/(M1+M2) < 20$, and $0.007 < D1/D2 < 0.05$.

where D1 is a center thickness of the optically transparent member, M1 is a center thickness of a layer of the first liquid, M2 is a center thickness of a layer of the second liquid, and D2 is a sum of center thicknesses of all optically transparent members in the projection optical system.

41. The method according to claim 40, wherein the first liquid and the second liquid are a same liquid.

42. The method according to claim 40, wherein the optically transparent member is a plane-parallel plate made of an amorphous material.

43. The method according to claim 42, wherein the amorphous material is silica.

44. The method according to claim 40, wherein a shape of a side face of the optically transparent member has a portion of a conical or pyramidal shape an apex of which is directed toward the second plane.

* * * * *